(12) United States Patent
Lu et al.

(10) Patent No.: US 11,426,832 B2
(45) Date of Patent: Aug. 30, 2022

(54) ULTRASONIC DRIVE AND DRIVING METHOD

(71) Applicant: Delta Electronics, Inc., Taoyuan (TW)

(72) Inventors: Yen-Ming Lu, Taoyuan (TW);
Chin-Wei Chang, Taoyuan (TW);
Ching-Hsiung Tsai, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 99 days.

(21) Appl. No.: 16/917,644

(22) Filed: Jun. 30, 2020

(65) Prior Publication Data
US 2021/0283738 A1     Sep. 16, 2021

(30) Foreign Application Priority Data

Mar. 12, 2020  (CN) .......................... 202010169076.2

(51) Int. Cl.
| *B23Q 17/09* | (2006.01) |
| *B06B 1/02* | (2006.01) |
| *G01R 19/00* | (2006.01) |

(52) U.S. Cl.
CPC ........ *B23Q 17/0961* (2013.01); *B06B 1/0284* (2013.01); *G01R 19/0046* (2013.01); *B23Q 2717/00* (2013.01)

(58) Field of Classification Search
CPC ............ B23Q 17/0961; B23Q 2717/00; B06B 1/0284; G01R 19/0046
See application file for complete search history.

(56) References Cited

U.S. PATENT DOCUMENTS

2003/0222535 A1* 12/2003 Gofman ................ B06B 1/0253
310/316.01

FOREIGN PATENT DOCUMENTS

| CN | 103567134 A | 2/2014 |
| CN | 105717831 A | 6/2016 |
| CN | 108705164 A | 10/2018 |
| CN | 110507389 A | 11/2019 |
| JP | 2009285611 A | 12/2009 |
| TW | 201410363 A | 3/2014 |
| TW | I448866 B | 8/2014 |
| TW | I480111 B | 4/2015 |

* cited by examiner

*Primary Examiner* — Daniel C Puentes
(74) *Attorney, Agent, or Firm* — Kirton McConkie; Evan R. Witt

(57) ABSTRACT

The present disclosure provides an ultrasonic drive and driving method configured for driving an ultrasonic tool. The ultrasonic drive includes a switch module, a sensing element and a control element. The sensing element senses the voltage and current of the ultrasonic tool and generates a sensing signal accordingly. The control element receives the sensing signal and outputs a control signal. The switch module outputs an ultrasonic signal according to the control signal for controlling the vibration of the ultrasonic tool. When the ultrasonic drive operates a frequency sweep function, the control element determines an operating interval and an operating frequency of the ultrasonic signal. When the ultrasonic drive operates a frequency following function, the control element adjusts the operating frequency according to the sensing signal for keeping the impedance of the ultrasonic tool consistent.

12 Claims, 4 Drawing Sheets

ULTRASONIC DRIVE AND DRIVING METHOD

CROSS-REFERENCE TO RELATED APPLICATION

This application claims priority to China Patent Application No. 202010169076.2, filed on Mar. 12, 2020. The entire contents of the above-mentioned patent applications are incorporated herein by reference for all purposes.

FIELD OF THE INVENTION

The present disclosure relates to an ultrasonic drive and driving method, and more particularly to the ultrasonic drive and driving method for driving an ultrasonic tool.

BACKGROUND OF THE INVENTION

Nowadays, the ultrasonic processing is introduced into the processing technology for increasing the processing speed and reducing the wear and tear of the processing cutter. During the ultrasonic processing, the cutter not only rotates but also vibrates in a direction perpendicular to the processing surface with high frequency. Accordingly, the cutter applies the hammering and abrasion effect to the workpiece through vibration, which makes the processing surface crack or crush into fine particles. Therefore, it is easier to remove the material on the workpiece, thereby improving the lifespan of cutter and the processing speed. However, as the ultrasonic tool and the cutter keep processing, the frequency-domain impedance characteristic of the ultrasonic tool may be varied due to the influences of temperature, pressure and deformation. In other words, at the same operating frequency, the impedance and the corresponding amplitude of the ultrasonic tool may be varied, which would affect the processing effect and quality of the cutter.

Therefore, there is a need of providing an ultrasonic drive and driving method to obviate the drawbacks encountered from the prior arts.

SUMMARY OF THE INVENTION

It is an objective of the present disclosure to provide an ultrasonic drive and driving method for driving an ultrasonic tool. When the frequency-domain impedance characteristic of the ultrasonic tool is varied, the ultrasonic drive and driving method can adjust the operating frequency of the ultrasonic tool instantly so as to keep the impedance of the ultrasonic tool consistent. Correspondingly, the amplitude of the ultrasonic tool is kept consistent as well. Therefore, the processing effect and quality of the ultrasonic tool can be ensured.

In accordance with an aspect of the present disclosure, there is provided an ultrasonic drive configured for driving an ultrasonic tool. The ultrasonic drive comprises a switch module, a sensing element and a control element. The sensing element is electrically connected to the switch module and the ultrasonic tool. The sensing element is configured for sensing a voltage and a current of the ultrasonic tool and generating a sensing signal according to the voltage and the current. The control element is electrically connected to the sensing element and the switch module for receiving the sensing signal and outputting a control signal to the switch module. The switch module outputs an ultrasonic signal to the ultrasonic tool according to the control signal, and the ultrasonic tool vibrates under the control of the ultrasonic signal. When the ultrasonic drive operates a frequency sweep function, the control element acquires a frequency-domain impedance characteristic and a resonance reference point of the ultrasonic tool according to the voltage and the current of the ultrasonic tool under different kinds of operating frequencies. The control element determines an operating interval and an operating frequency of the ultrasonic signal in the frequency-domain impedance characteristic according to the resonance reference point. When the ultrasonic tool vibrates at the operating frequency, the ultrasonic drive operates a frequency following function. The control element adjusts the operating frequency according to the sensing signal for keeping an impedance of the ultrasonic tool consistent, and the adjusted operating frequency falls within the operating interval as well.

In accordance with an aspect of the present disclosure, there is further provided an ultrasonic driving method configured for driving an ultrasonic tool. The ultrasonic driving method comprises steps: (a) operating a frequency sweep function, acquiring a frequency-domain impedance characteristic and a resonance reference point of the ultrasonic tool according to a voltage and a current of the ultrasonic tool under different kinds of operating frequencies, and determining an operating interval and an operating frequency in the frequency-domain impedance characteristic according to the resonance reference point; (b) diagnosing characteristics of the ultrasonic tool, and controlling the ultrasonic tool to stop operating if the diagnosis result being abnormal; (c) determining an operating power; (d) controlling the ultrasonic tool to vibrate at the operating power and the operating frequency; (e) determining whether the voltage and the current of the ultrasonic tool are in a steady state, operating a step (f) if the determining result is satisfied, and operating a step (h) if the determining result is not satisfied; (f) operating a frequency following function to adjust the operating frequency for keeping an impedance of the ultrasonic tool consistent, wherein the adjusted operating frequency falls within the operating interval; (g) determining whether there is a variance occurring in the system, operating the step (h) if the determining result is satisfied, and operating the step (f) if the determining result is not satisfied; and (h) determining whether the variance occurring in the system is controllable, operating the step (b) if the determining result is satisfied, and controlling the ultrasonic tool to stop operating if the determining result is not satisfied.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
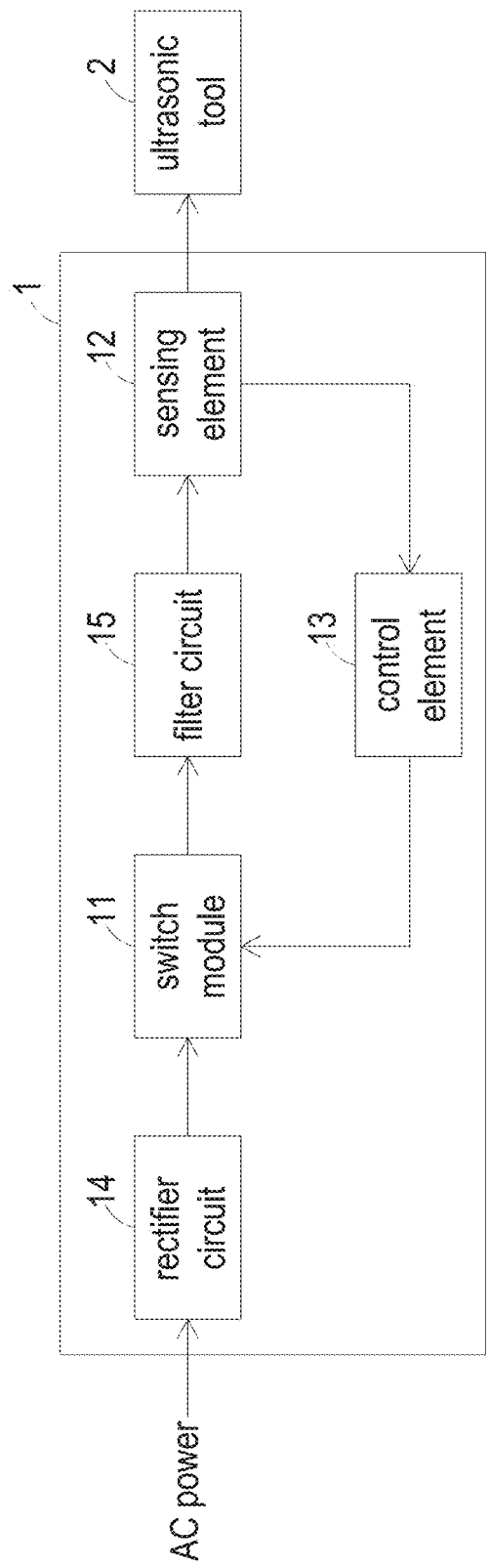
FIG. 1 is a schematic circuit block diagram illustrating an ultrasonic drive and an ultrasonic tool according to an embodiment of the present disclosure.

FIG. 1 is a schematic circuit block diagram illustrating an ultrasonic drive and an ultrasonic tool according to an embodiment of the present disclosure. As shown in FIG. 1, an ultrasonic drive 1 is configured for driving an ultrasonic tool 2. The ultrasonic drive 1 includes a switch module 11, a sensing element 12, a control element 13, a rectifier circuit 14 and a filter circuit 15. The ultrasonic tool 2 can be any tool capable of vibrating under the control of ultrasonic signal. The sensing element 12 is electrically connected to the switch module 11 and the ultrasonic tool 2. The sensing element 12 is configured for sensing the voltage and current of the ultrasonic tool 2 and generating a sensing signal according to the sensed voltage and current. The control element 13 is electrically connected to the sensing element 12 and the switch module 11 for receiving the sensing signal from the sensing element 12 and outputting a control signal to the switch module 11. According to the sensing signal, the control element 13 acknowledges the voltage and current of the ultrasonic tool 2. Moreover, the control element 13 figures out an impedance of the ultrasonic tool 2 and generates the control signal according to the impedance of the ultrasonic tool 2. The switch module 11 outputs an ultrasonic signal to the ultrasonic tool 2 according to the control signal. Under the control of the ultrasonic signal, the ultrasonic tool 2 vibrates at the operating frequency of the ultrasonic signal. In an embodiment, the control element 13 controls the switch operation of the switch module 11 through the control signal, thereby adjusting the operating frequency of the ultrasonic signal outputted by the switch module 11. The rectifier circuit 14 is electrically connected to the switch module 11. The rectifier circuit 14 receives an AC (alternating current) power and converts the AC power into a DC (direct current) power. The filter circuit 15 is electrically connected between the switch module 11 and the sensing element 12. The filter circuit 15 filters the DC power and outputs the filtered DC power to the ultrasonic tool 2 as power supply. In addition, the filter circuit 15 can also be utilized to filter the ultrasonic signal outputted by the switch module 11.

When the ultrasonic tool 2 starts to operate, the ultrasonic drive 1 operates a frequency sweep function. Under the frequency sweep function, the ultrasonic drive 1 transmits a voltage command with low-to-high frequency to the ultrasonic tool 2. The sensing element 12 senses the voltage and current of the ultrasonic tool 2 under different kinds of operating frequencies. Accordingly, the control element 13 derives the impedance of the ultrasonic tool 2 under different kinds of operating frequencies and therefore acquires the frequency-domain impedance characteristic of the ultrasonic tool 2. There is a resonance reference point in the frequency-domain impedance characteristic. The control element 13 determines an operating interval in the frequency-domain impedance characteristic according to the resonance reference point and determines an initial operating frequency in the operating interval. In an embodiment, the initial operating frequency is the center frequency of the operating interval.

As the ultrasonic tool 2 keeps processing, the frequency-domain impedance characteristic of the ultrasonic tool 2 shifts due to the influences of temperature, stress, deformation, etc. In other words, the impedance and amplitude of the ultrasonic tool 2 at the initial operating frequency vary gradually. Since the sensing element 12 keeps sensing the voltage and current of the ultrasonic tool 2, the control element 13 can be aware of the variation of the impedance of the ultrasonic tool 2 immediately through the sensing signal from the sensing element 12. Under this circumstance, the ultrasonic drive 1 operates a frequency following function, and the control element 13 adjusts the operating frequency of the ultrasonic tool 2 according to the sensing signal for keeping the impedance and amplitude of the ultrasonic tool 2 consistent. It is noted that the ultrasonic drive 1 adjusts the operating frequency within the scope of the operating interval. Namely, the adjusted operating frequency has to fall within the operating interval as well.

Through the frequency sweep function, the ultrasonic drive 1 acquires the frequency-domain impedance characteristic and the resonance reference point of the ultrasonic tool 2, and the ultrasonic drive 1 further determines the operating interval and the initial operating frequency. When the frequency-domain impedance characteristic of the ultrasonic tool 2 shifts, the ultrasonic drive 1 operates the frequency following function to adjust the operating frequency for keeping the impedance and amplitude of the ultrasonic tool 2 consistent. Consequently, the processing quality is ensured.

In an embodiment, when the ultrasonic drive 1 operates the frequency sweep function, the determined initial operating frequency is corresponding to a reference impedance. When the ultrasonic drive 1 operates the frequency following function, the control element 13 acquires the actual impedance of the ultrasonic tool 2 according to the sensing signal, and the control element 13 adjusts the operating frequency for keeping the actual impedance consistent with the reference impedance.

Figure 2:
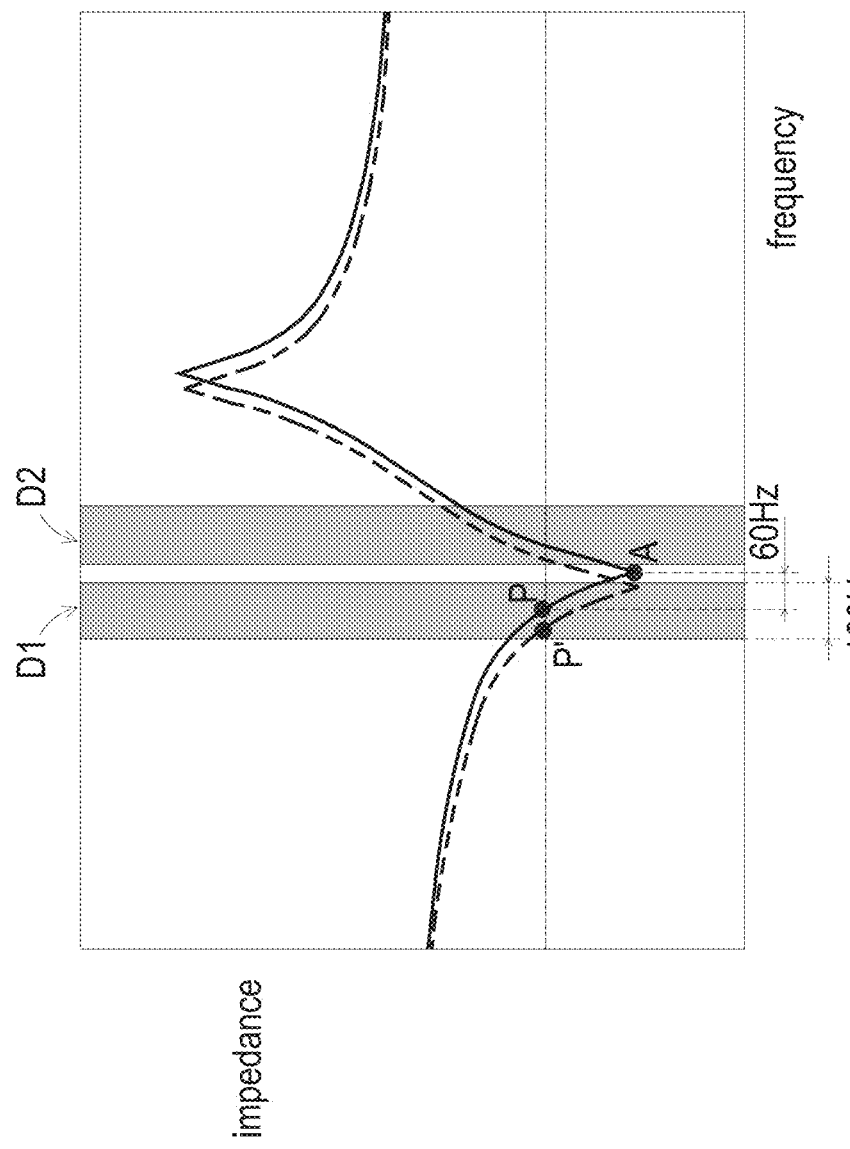
FIG. 2 is a schematic oscillogram showing an initial frequency-domain impedance characteristic and the shifted frequency-domain impedance characteristic of the ultrasonic tool of FIG. 1.

FIG. 2 is a schematic oscillogram showing an initial frequency-domain impedance characteristic and the shifted frequency-domain impedance characteristic of the ultrasonic tool. When the ultrasonic tool 2 starts to operate, the frequency-domain impedance characteristic obtained by operating the frequency sweep function is depicted by solid line in FIG. 2. After the ultrasonic tool 2 operates for a while, the shifted frequency-domain impedance characteristic is depicted by dotted line in FIG. 2. In the initial frequency-domain impedance characteristic, the ultrasonic tool 2 has a minimum impedance at the resonance reference point A, and the operating interval can be set at both left side and right side of the resonance reference point A (e.g., the operating intervals D1 and D2 shown in FIG. 2). The width of the operating interval is for example but not limited to 100 Hz, and the difference between the center frequency of the operating interval and the frequency corresponding to the resonance reference point A is for example but not limited to 60 Hz. The following exemplified illustration is based on selecting the operating interval D1. For example, the frequency corresponding to the point P is set as the initial operating frequency of the ultrasonic tool 2. After the ultrasonic tool 2 operates for a while, the frequency-domain impedance characteristic shifts. Therefore, under the initial operating frequency, the impedance of the ultrasonic tool 2 is varied. In order to keep the impedance of the ultrasonic tool 2 consistent, the ultrasonic drive 1 operates the frequency following function so as to adjust the operating frequency of the ultrasonic tool 2 to the frequency corresponding to the point P'. The impedances corresponding to the points P and P' are the same. Consequently, the ultrasonic drive 1 can control the impedance of the ultrasonic tool 2 to be consistent. In an embodiment, in the operating interval, the correlation between the operating frequency and impedance of the ultrasonic tool 2 is maintained to be a negative correlation (e.g., the operating interval D1) or a positive correlation (e.g., the operating interval D2). Specifically, if the ultrasonic drive 1 selects the operating interval D1 while operating the frequency sweep function, the correlation between the operating frequency and the impedance of the ultrasonic tool 2 is maintained to be a negative correlation. Alternatively, if the ultrasonic drive 1 selects the operating interval D2 while operating the frequency sweep function, the correlation between the operating frequency and the impedance of the ultrasonic tool 2 is maintained to be a positive correlation. Consequently, the operating interval can be determined according to actual requirements, and the ultrasonic drive 1 can have the only way to adjust the operating frequency when the frequency-domain impedance characteristic shifts.

In an embodiment, the ultrasonic drive 1 only operates the frequency following function when the whole system, which includes the ultrasonic drive and the ultrasonic tool, is stable. The criterion for determining whether the whole system is stable or not depends on actual situation. For example, if the sensed voltage and current of the ultrasonic tool 2 are not in a steady state, it is regarded that a variance occurs in the system, namely the system is unstable. Similarly, if the user changes the output power, the change of the output power causes the voltage and current of the ultrasonic tool 2 to be unstable, and it is regarded that a variance occurs in the system as well. Whether the voltage and current of the ultrasonic tool 2 are in the steady state can be determined according to the variation range of the voltage and current of the ultrasonic tool 2. If the variation range of the voltage and current sensed by the sensing element 12 is small (for example but not limited to 5%), the voltage and current of the ultrasonic tool 2 are in the steady state. Moreover, in an embodiment, if the impedance variation of the ultrasonic tool 2 exceeds the default range, it is regarded that a variance occurs in the system. The default range is for example but not limited to fall within 5%-20%, and the default range can be adjusted according to actual requirements.

Figure 3:
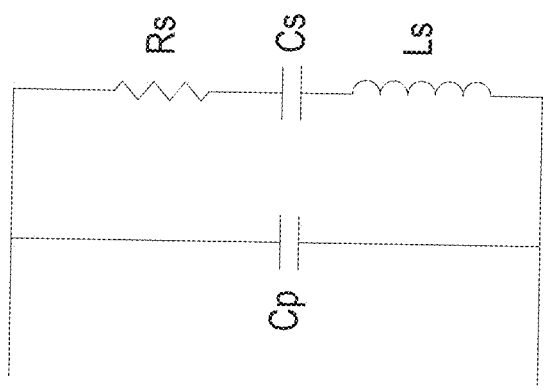
FIG. 3 is a schematic equivalent circuit diagram of the ultrasonic tool of FIG. 1.

Furthermore, in an embodiment, whether the sensing signal and the frequency-domain impedance characteristic acquired by the ultrasonic drive 1 are correct can be verified through the equivalent circuit of the ultrasonic tool 2. Meanwhile, the verifying result can be utilized for determining whether there is a variance occurring in the system. Specifically, as shown in FIG. 3, the ultrasonic tool 2 has an equivalent circuit including a resistance Rs, capacitances Cp and Cs, and an inductance Ls. The transfer function of the equivalent circuit is shown in the equation (1).

$$TF = \frac{1}{Cp \cdot s + \frac{1}{\frac{1}{Cs \cdot s} + Rs + Ls \cdot s}} \quad (1)$$

There are a plurality of default parameters preset in the equivalent circuit, and the plurality of default parameters are the default values of the resistance Rs, the capacitances Cp and Cs, and the inductance Ls. The plurality of default parameters are acquired by the ultrasonic drive 1 through operating the frequency following function. The control element substitutes the acquired sensing signal and frequency-domain impedance characteristic into the equation (1) so as to obtain the actual values of the resistance Rs, the capacitances Cp and Cs, and the inductance Ls. The actual values are regarded as the actual parameters of the equivalent circuit. Therefore, the default parameters and the actual parameters can be compared. If the actual parameters are consistent with the default parameters, the sensing signal and frequency-domain impedance characteristic acquired by the ultrasonic drive 1 are correct, and the system is stable. On the contrary, if the actual parameters are not consistent with the default parameters, there is a variance occurring in the system.

Figure 4:
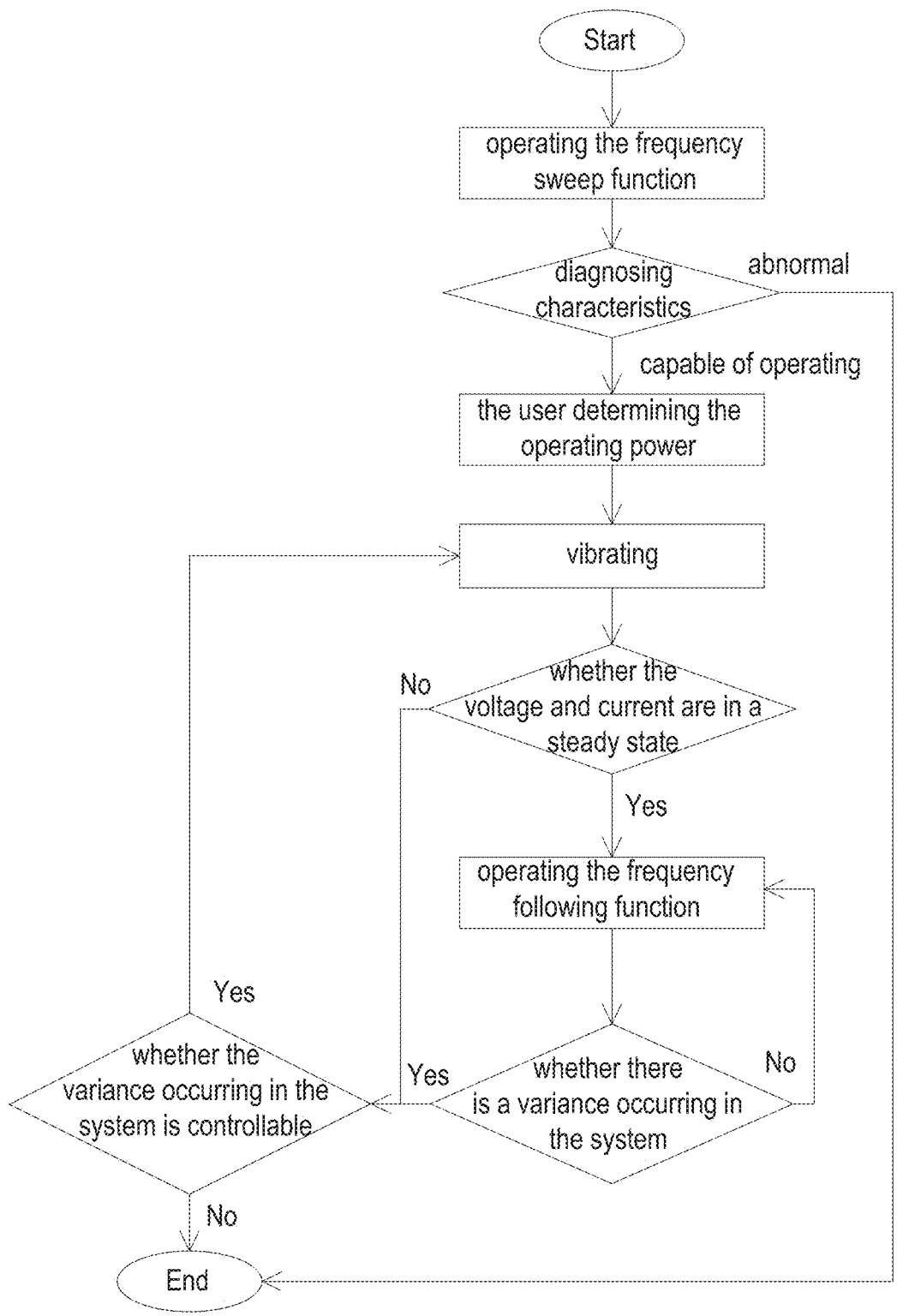
FIG. 4 is a schematic flowchart illustrating an ultrasonic driving method according to an embodiment of the present disclosure.

FIG. 4 is a schematic flowchart illustrating an ultrasonic driving method according to an embodiment of the present disclosure. As shown in FIG. 4, firstly, the ultrasonic drive 1 operates the frequency following function for acquiring the frequency-domain impedance characteristic, the resonance reference point and the initial operating frequency of the ultrasonic tool 2. Then, the characteristics of the ultrasonic tool 2 are diagnosed, for example but not limited to diagnose whether the frequency-domain impedance characteristic of the ultrasonic tool 2 is abnormal. If the characteristics of the ultrasonic tool 2 are diagnosed to be abnormal, the ultrasonic tool 2 is stopped operating. If the ultrasonic tool 2 is diagnosed to be capable of operating, the user is allowed to determine the operating power. After the operating power is determined, the ultrasonic drive 1 controls the ultrasonic tool 2 to vibrate at the initial operating frequency. Afterward, when the voltage and current of the ultrasonic tool 2 are in the steady state, the ultrasonic drive 1 keeps operating the frequency following function so as to keep the impedance of the ultrasonic tool 2 consistent. Nevertheless, if the variance occurring in the system is found, the ultrasonic drive 1 does not operate the frequency following function. The specific situation of the variance occurring in the system can be for example but not limited to the voltage and current of the ultrasonic tool 2 not being in the steady state, the user changing the operating power, or the actual parameters of the equivalent circuit of the ultrasonic tool not being consistent with the default parameters. When there is a variance occurring in the system, whether the variance occurring in the system is controllable is determined. If the variance is not controllable, the ultrasonic drive 1 stops operating. If the variance is controllable, the ultrasonic drive 1 keeps driving the ultrasonic tool 2 to vibrate, and the ultrasonic drive 1 does not operate the frequency following function until the voltage and current of the ultrasonic tool 2 are in the steady state.

When the operating power is changed, the voltage and current of the ultrasonic tool 2 vary accordingly. At this moment, the voltage and current of the ultrasonic tool 2 are in a transient state. After a while, the voltage and current of the ultrasonic tool 2 become stable and return to the steady state.

From the above descriptions, the present disclosure provides an ultrasonic drive and driving method for driving the ultrasonic tool. Through operating the frequency sweep function, the ultrasonic drive and driving method can acquire the frequency-domain impedance characteristic and the resonance reference point of the ultrasonic tool and determine the operating interval and the initial operating frequency. When the frequency-domain impedance characteristic of the ultrasonic tool shifts, the ultrasonic drive and driving method operate the frequency following function to adjust the operating frequency for keeping the impedance and the amplitude of the ultrasonic tool consistent. Consequently, the quality of processing is ensured. In addition, the ultrasonic tool has an equivalent circuit. The ultrasonic drive acquires the default parameters of the equivalent circuit by operating the frequency sweep function. Meanwhile, the ultrasonic drive acquires the actual parameters of the equivalent circuit according to the sensing signal and the frequency-domain impedance characteristic. Therefore, the ultrasonic drive can verify the acquired sensing signal and frequency-domain impedance characteristic by comparing the default parameters with the actual parameters, and the verifying result is utilized for determining that the system is in a steady state or a variance state.

While the disclosure has been described in terms of what is presently considered to be the most practical and preferred embodiments, it is to be understood that the disclosure needs not be limited to the disclosed embodiment.

What is claimed is:

1. An ultrasonic drive configured for driving an ultrasonic tool, the ultrasonic drive comprising:
a switch module;
a sensing element electrically connected to the switch module and the ultrasonic tool, wherein the sensing element is configured for sensing a voltage and a current of the ultrasonic tool and generating a sensing signal according to the voltage and the current; and
a control element electrically connected to the sensing element and the switch module for receiving the sensing signal and outputting a control signal to the switch module, wherein the switch module outputs an ultrasonic signal to the ultrasonic tool according to the control signal, and the ultrasonic tool vibrates under the control of the ultrasonic signal,
wherein when the ultrasonic drive operates a frequency sweep function, the control element acquires a frequency-domain impedance characteristic and a resonance reference point of the ultrasonic tool according to the voltage and the current of the ultrasonic tool under different kinds of operating frequencies, and the control element determines an operating interval and an operating frequency of the ultrasonic signal in the frequency-domain impedance characteristic according to the resonance reference point,
wherein when the ultrasonic tool vibrates at the operating frequency, the ultrasonic drive operates a frequency following function, the control element adjusts the operating frequency according to the sensing signal for keeping an impedance of the ultrasonic tool consistent, and the adjusted operating frequency falls within the operating interval as well.

2. The ultrasonic drive according to claim 1, wherein when the ultrasonic drive operates the frequency sweep function, the determined operating frequency is corresponding to a reference impedance, the control element acquire an actual impedance of the ultrasonic tool according to the sensing signal when the ultrasonic drive operates the frequency following function, and the control element adjusts the operating frequency for keeping the actual impedance consistent with the reference impedance.

3. The ultrasonic drive according to claim 1, wherein in the frequency-domain impedance characteristic, the ultrasonic tool has a minimum impedance at the resonance reference point.

4. The ultrasonic drive according to claim 1, wherein the ultrasonic drive operates the frequency following function when the voltage and the current of the ultrasonic tool are in a steady state.

5. The ultrasonic drive according to claim 1, wherein the ultrasonic tool has an equivalent circuit, the ultrasonic drive acquires a plurality of default parameters of the equivalent circuit by operating the frequency sweep function, the control element acquires a plurality of actual parameters of the equivalent circuit according to the frequency-domain impedance characteristic and the sensing signal, and the control element compares the plurality of default parameters with the plurality of actual parameters to verify the frequency-domain impedance characteristic and the sensing signal.

6. The ultrasonic drive according to claim 1, further comprising a rectifier circuit and a filter circuit, wherein the rectifier circuit is electrically connected to the switch module, the rectifier circuit receives and converts an AC power into a DC power, the filter circuit is electrically connected between the switch module and the sensing element, and the filter circuit filters the DC power and outputs the filtered DC power to the ultrasonic tool.

7. The ultrasonic drive according to claim 6, wherein the filter circuit filters the ultrasonic signal outputted by the switch module.

8. An ultrasonic driving method configured for driving an ultrasonic tool, the method comprising:
(a) operating a frequency sweep function, acquiring a frequency-domain impedance characteristic and a resonance reference point of the ultrasonic tool according to a voltage and a current of the ultrasonic tool under different kinds of operating frequencies, and determining an operating interval and an operating frequency in the frequency-domain impedance characteristic according to the resonance reference point;
(b) diagnosing characteristics of the ultrasonic tool, and controlling the ultrasonic tool to stop operating if the diagnosis result being abnormal;
(c) determining an operating power;
(d) controlling the ultrasonic tool to vibrate at the operating power and the operating frequency;
(e) determining whether the voltage and the current of the ultrasonic tool are in a steady state, operating a step (f) if the determining result of the step (e) is satisfied, and operating a step (h) if the determining result of the step (e) is not satisfied;
(f) operating a frequency following function to adjust the operating frequency for keeping an impedance of the ultrasonic tool consistent, wherein the adjusted operating frequency falls within the operating interval;
(g) determining whether there is a variance occurring in the system, operating the step (h) if the determining result of the step (g) is satisfied, and operating the step (f) if the determining result of the step (g) is not satisfied; and
(h) determining whether the variance occurring in the system is controllable, operating the step (b) if the determining result of the step (h) is satisfied, and controlling the ultrasonic tool to stop operating if the determining result of the step (h) is not satisfied.

9. The ultrasonic driving method according to claim 8, wherein a variation range of the impedance of the ultrasonic tool is smaller than a default range.

10. The ultrasonic driving method according to claim 8, wherein in the operating interval, the correlation between the operating frequency and the impedance of the ultrasonic tool is a positive correlation.

11. The ultrasonic driving method according to claim 8, wherein in the operating interval, the correlation between the operating frequency and the impedance of the ultrasonic tool is a negative correlation.

12. The ultrasonic driving method according to claim 8, wherein in the step (a), the operating frequency acquired by operating the frequency sweep function is a center frequency of the operating interval.

* * * * *